(12) United States Patent
Sun

(10) Patent No.: US 7,911,119 B2
(45) Date of Patent: Mar. 22, 2011

(54) HEAT DISSIPATING DEVICE HAVING TURBINE VENTILATOR AND LED LAMP COMPRISING THE SAME

(75) Inventor: Tsung-Ting Sun, Chung-Ho (TW)

(73) Assignee: Edison Opto Corporation, Taipei (TW)

( * ) Notice: Subject to any disclaimer, the term of this patent is extended or adjusted under 35 U.S.C. 154(b) by 204 days.

(21) Appl. No.: 12/258,592

(22) Filed: Oct. 27, 2008

(65) Prior Publication Data

US 2010/0102696 A1 Apr. 29, 2010

(51) Int. Cl.
*F21V 29/02* (2006.01)
*H01K 1/58* (2006.01)

(52) U.S. Cl. .......... 313/46; 362/294; 361/697; 361/710
(58) Field of Classification Search .............. 313/46, 313/498; 362/294; 361/697, 710
See application file for complete search history.

(56) References Cited

U.S. PATENT DOCUMENTS

| 6,631,999 B1* | 10/2003 | Chang | 362/96 |
| 2006/0193139 A1* | 8/2006 | Sun et al. | 362/373 |
| 2007/0254584 A1* | 11/2007 | Chang et al. | 454/233 |
| 2008/0055909 A1* | 3/2008 | Li | 362/294 |
| 2009/0129092 A1* | 5/2009 | Chen | 362/294 |
| 2009/0160344 A1* | 6/2009 | Hsu et al. | 315/117 |

* cited by examiner

*Primary Examiner* — Karabi Guharay
(74) *Attorney, Agent, or Firm* — Chun-Ming Shih; HDLS IPR Services

(57) ABSTRACT

A heat dissipating device includes a heat dissipater and a turbine ventilator. The heat dissipater includes a plurality of heat dissipating fins arranged at interval, wherein a heat dissipating passage is defined between two adjacent heat dissipating fins. The turbine ventilator is connected to one side of the heat dissipater, and the turbine ventilator has a central axis and the axial line of the central axis is in parallel to the heat dissipating passage. An LED lighting module can be attached to one side of the heat dissipater of the heat dissipating device. Therefore, the heat dissipating device dissipates heat of the LED lighting module without consuming additional electrical power.

2 Claims, 6 Drawing Sheets

HEAT DISSIPATING DEVICE HAVING TURBINE VENTILATOR AND LED LAMP COMPRISING THE SAME

BACKGROUND OF THE INVENTION

1. Field of the Invention

The present invention generally relates to a heat dissipating device, in particular to a heat dissipating device for an LED lamp.

2. Description of Prior Art

Generally speaking, as light emitting diodes (LEDs) come with the features of low power consumption, power saving, long service time, small size and quick response etc., LED lamps gradually substitute traditional light bulbs and have been extensively used in various light emitting devices.

A plurality of LEDs are usually used together to comprise an LED module for increasing the lighting area and luminance. As the number of LED used increased, the heat generated from the operating LED module also increased. If the heat cannot be dissipated sufficiently, it will reduce the lifetime of LEDs and result in higher maintenances cost. Hence, the generated heat from LEDs usually requires a heat dissipating device to thermally manage the temperature for maintaining its normal operation. Therefore, a good heat dissipating structure for an LED lamp has become an important matter for this industry.

Conventional heat dissipating structure for an LED lamp comprises a plurality of heat dissipating fins at the back of an LED module to speed up heat dissipation via natural convention by having large heat-dissipation surface areas. In addition, forced convection can be achieved by a heat dissipating fan positioned on the heat dissipating fins to quickly lower the temperature fast. However, the additional heat dissipating fan consumes extra electricity, which contradicts the purposes of replacing traditional lamp devices for power saving and environment protecting. Some heat dissipating fans in operation will make loud noise. It not only increases power consumption but also makes user uncomfortable.

In view of the above drawbacks, the Inventor proposes the present invention based on his expert knowledge and elaborate researches in order to solve the problems of prior art.

SUMMARY OF THE INVENTION

The objective of present invention is to provide a heat dissipating device having a turbine ventilator to dissipate the heat of an LED lamp without consuming extra electricity, thus improving economical and practical utility.

In order to achieve the objective mentioned above, the present invention provides a heat dissipating device having a turbine ventilator. The heat dissipating device comprises a heat dissipater and a turbine ventilator. The heat dissipater includes a plurality of heat dissipating fins which arranged at interval, where a heat dissipating passage is defined between two adjacent heat dissipating fins. The turbine exhaust is connected to one side of the heat dissipater and has a central axis and the axial line of the central axis parallels to the heat dissipating passage.

Another objective of the present invention is to provide an LED lamp comprising a heat dissipating device having a turbine ventilator which during operation, the turbine ventilator makes no noise. Users would not feel uncomfortable when using the heat dissipating device.

In order to achieve the objective mentioned above, the present invention provides an LED lamp comprising a heat dissipating device having a turbine ventilator. An LED lighting module comprises a substrate and a plurality of LEDs. The substrate has a heat conducting surface and a light emitting surface on which the LEDs are disposed. A heat dissipating device comprises a heat dissipater and a turbine ventilator. The heat dissipater includes a plurality of heat dissipating fins which arranged at interval, where a heat dissipating passage is defined between two adjacent heat dissipating fins. The turbine exhaust is connected to one side of the heat dissipater and has a central axis and the axial line of the central axis parallels to the heat dissipating passage.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
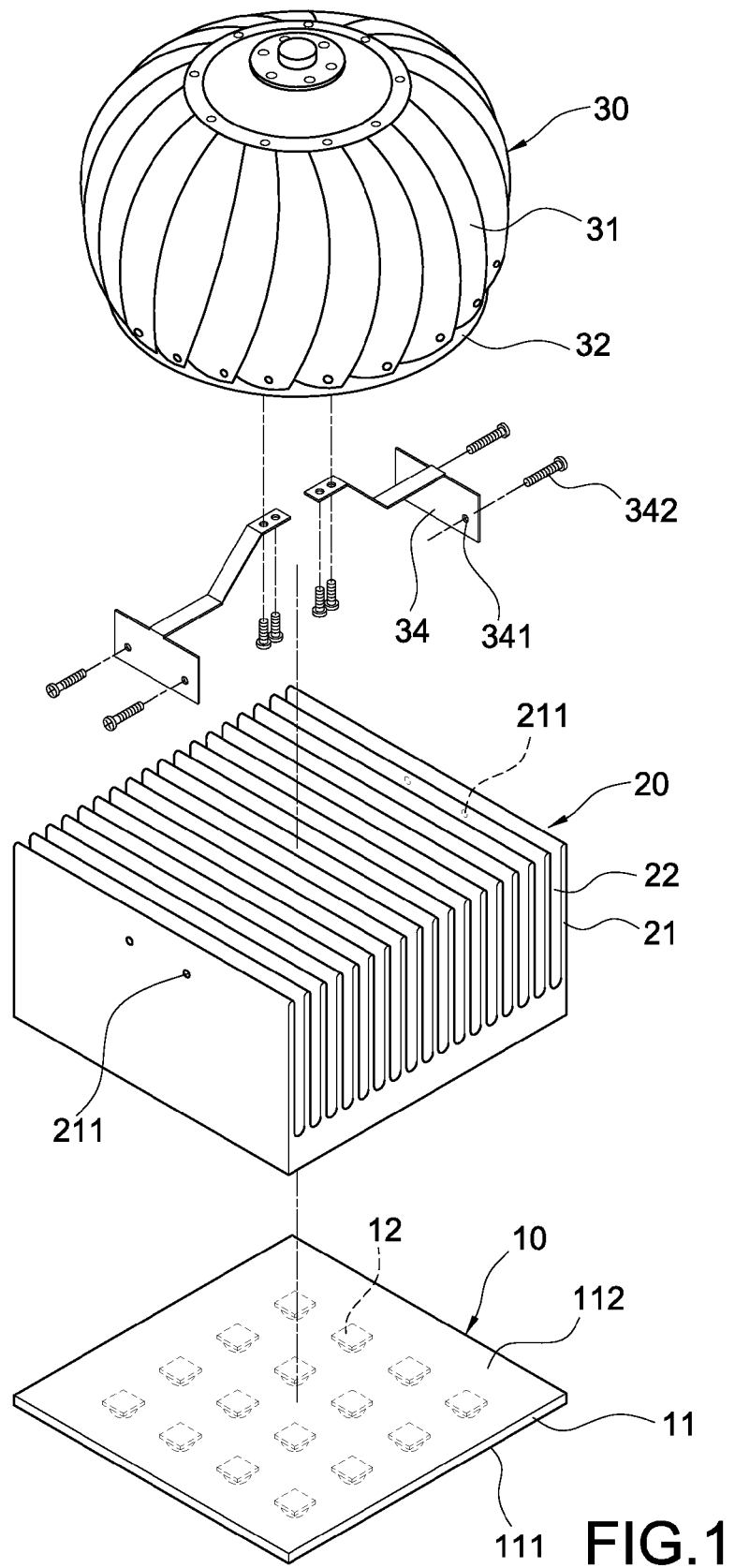
FIG. 1 is an exploded perspective view according to the present invention.
Figure 2:
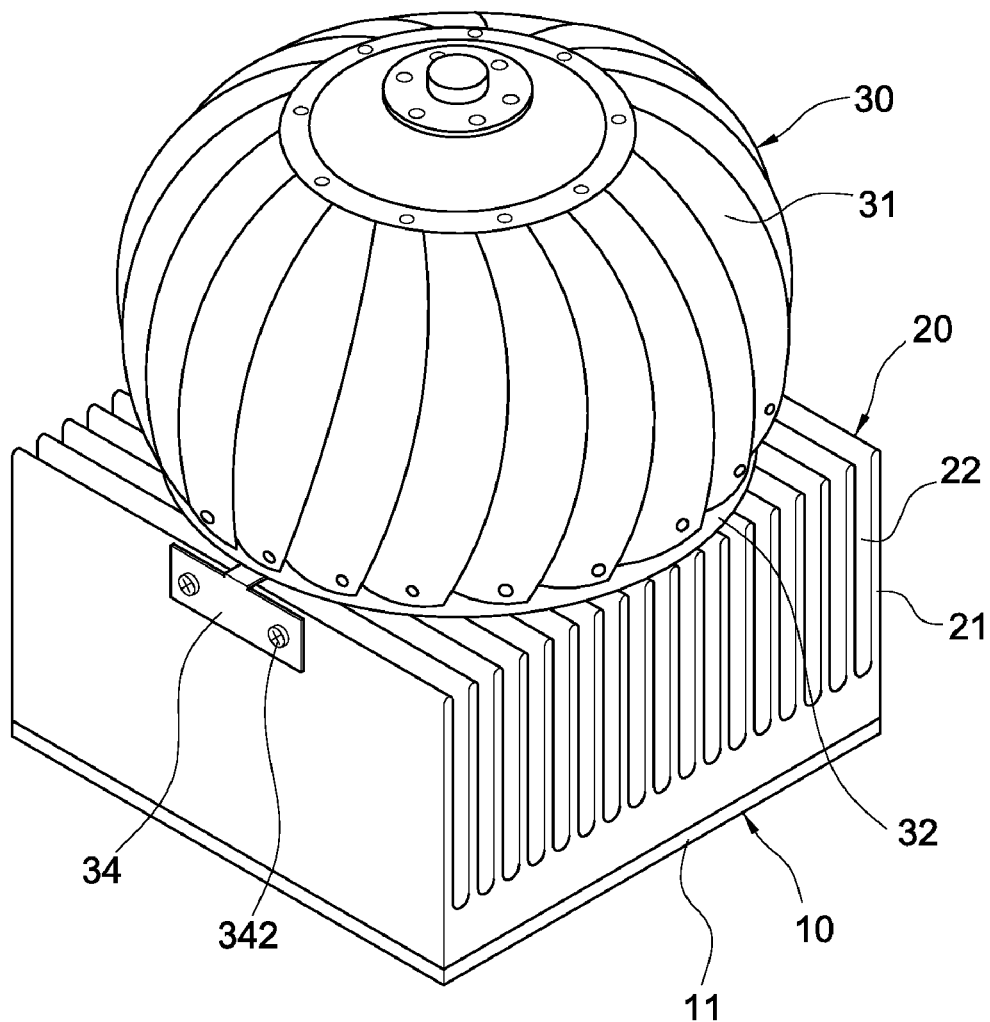
FIG. 2 is a schematic view showing the present invention.

With refer to FIG. 1 and FIG. 2, an exploded perspective view of the present invention and a schematic view showing the present invention are respectively shown. The present invention provides a heat dissipating device having a turbine ventilator. The heat dissipating device comprises a heat dissipater 20 and a turbine ventilator 30. The heat dissipater 20 includes a plurality of heat dissipating fins 21 which arranged at interval, where a heat dissipating passage 22 is defined between two adjacent heat dissipating fins 21. The turbine ventilator 30 is composed of a plurality of bent fins 31 which are installed on a frame 32 and are assembled to form a sphere. The turbine ventilator 30 further comprises a retainer 34 connected to the bottom of the turbine ventilator 30. A screw hole 341 is defined on one side of the retainer 34, and a fixing hole 211 corresponding to the screw hole 341 is defined on the heat dissipating fins 21. A screw 342 is threaded in the screw hole 341 and the fixing hole 211 to retain the retainer 34 on one side of the heat dissipating dissipater 20. Another side of the retainer 34 also defined a plurality of screw holes 342, and a plurality of screws 344 are threaded in the screw hole 343 to connect the retainer 34 on the bottom of the turbine ventilator 30. Hence, the turbine ventilator 30 is retained to one side of the heat dissipater 20 by the retainer 34.

Moreover, the invention also provides an LED lamp comprising a heat dissipating device having a turbine ventilator. In above structure, an LED lighting module 10 is attached to one side of the heat dissipater 20. The LED lighting module 10 comprises a substrate 11 and a plurality of LEDs 12. The substrate 11 has a heat conducting surface 112 and a light emitting surface 111 on which the LEDs 12 are disposed. The heat dissipater 20 is attached to the heat conducting surface 112 to complete the LED lamp comprising a heat dissipating device having a turbine ventilator.

Figure 3:
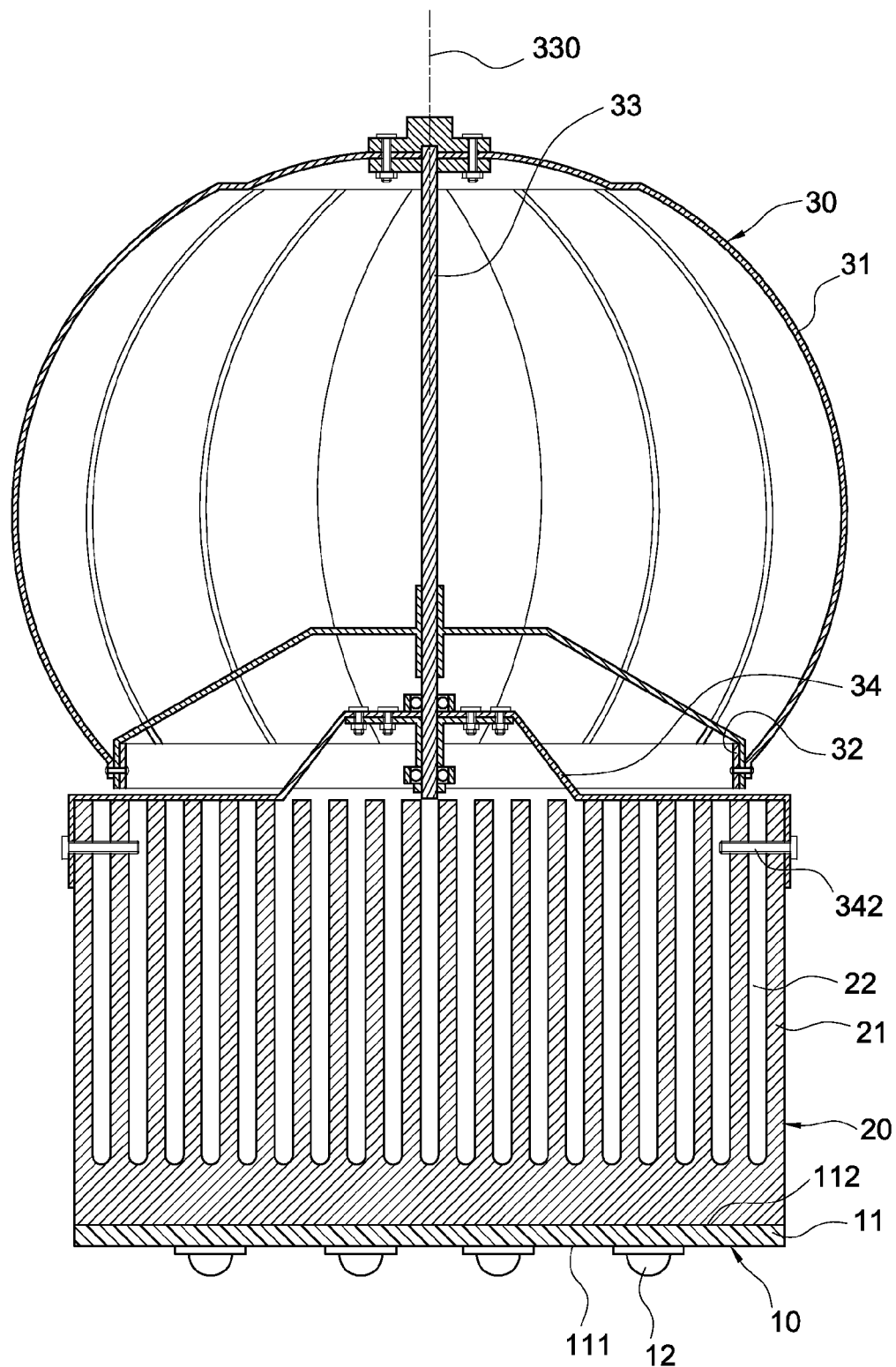
FIG. 3 is an assembled cross section view according to the present invention.

Please refer to FIG. 3, an assembled cross section view according to the present invention is shown. The heat dissipater 20 is attached on the heat conducting surface 112 of the substrate 11 of the LED lighting module 10, and the turbine ventilator 30 is assembled on the top of the heat dissipater 20. A retainer 34 is arranged on the bottom of the turbine exhaust 30 and the retainer 34 is fixed to the heat dissipating fins 21 of the heat dissipater 20 by screws 342. Moreover, the turbine ventilator 30 has a central axis 33 and the axial line 330 of the central axis 33 parallels to the heat dissipating passage 22 defined between two adjacent heat dissipating fins 21.

Figure 4:
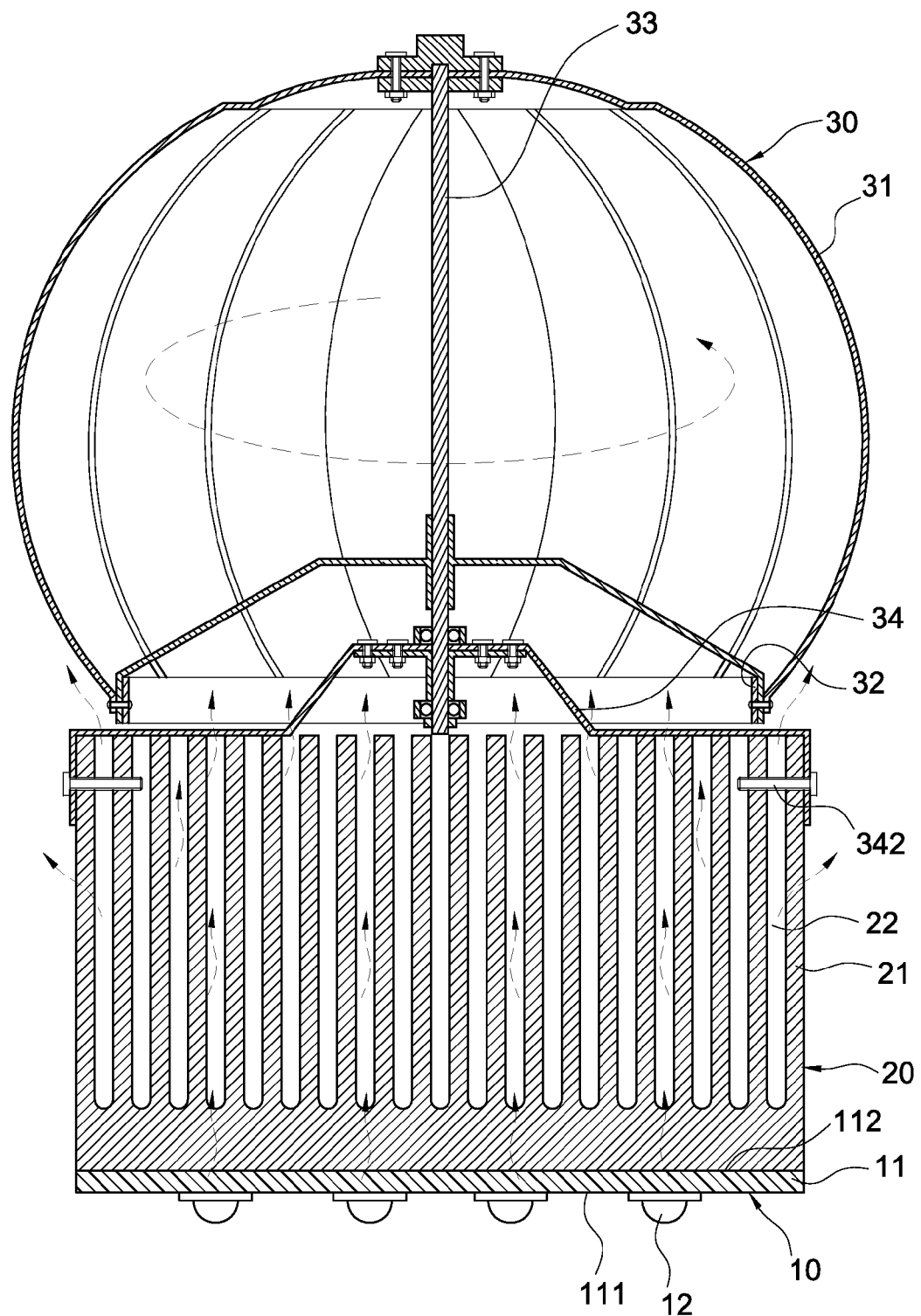
FIG. 4 is a schematic view showing the operating state of an embodiment according to the present invention.

With refer to FIG. 4, a schematic view showing the operating state of an embodiment of the present invention is shown. After a period of operation time, the heat generated from the operated LED lighting module 10 is conducted to the heat dissipater 20 arranged on the substrate 11 to dissipate heat along the heat dissipating fins 21 having large heat-dissipation surface areas. Moreover, part of the heat arising from the heat dissipating passage 22 is formed between the heat dissipating fins 21. It passes through the dissipating passage 22 and enters into the fins 31 of the turbine ventilator 30 to rotate the fins 31. When the turbine ventilator 30 keeps rotating, the heat at lower portion of the heat dissipating device can be convected to flow upward and rotate the fins 31 at high speed. Therefore, heat can be dissipated with good ventilation. In the heat dissipating device of the present invention, the rotation of the turbine ventilator 30 does not need additional electricity; therefore, enhanced efficiency of heat dissipation can be achieved with reduced power consumption.

Figure 5:
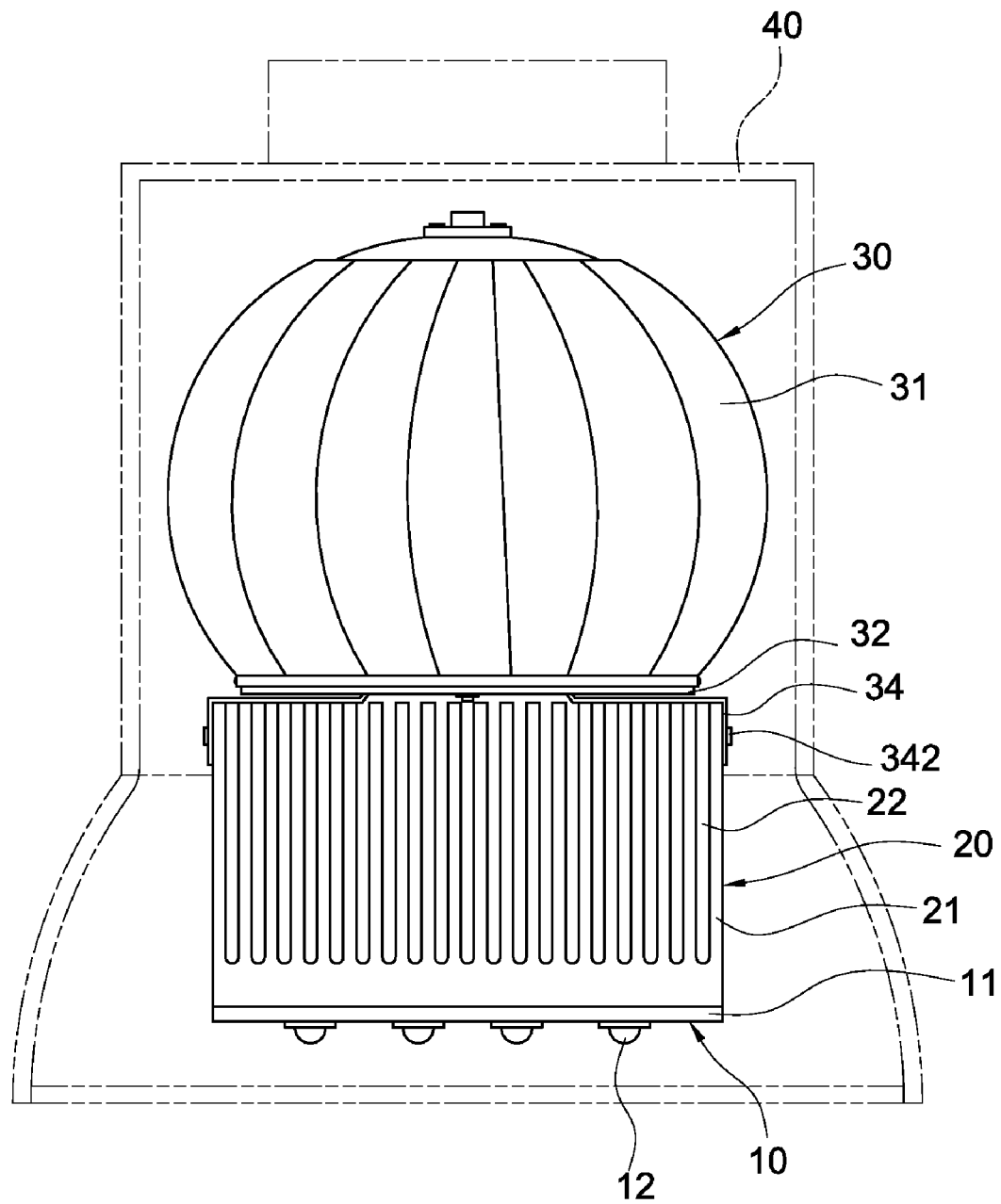
FIG. 5 is a schematic view of an application in a lighting luminance bracket according to the present invention.
Figure 6:
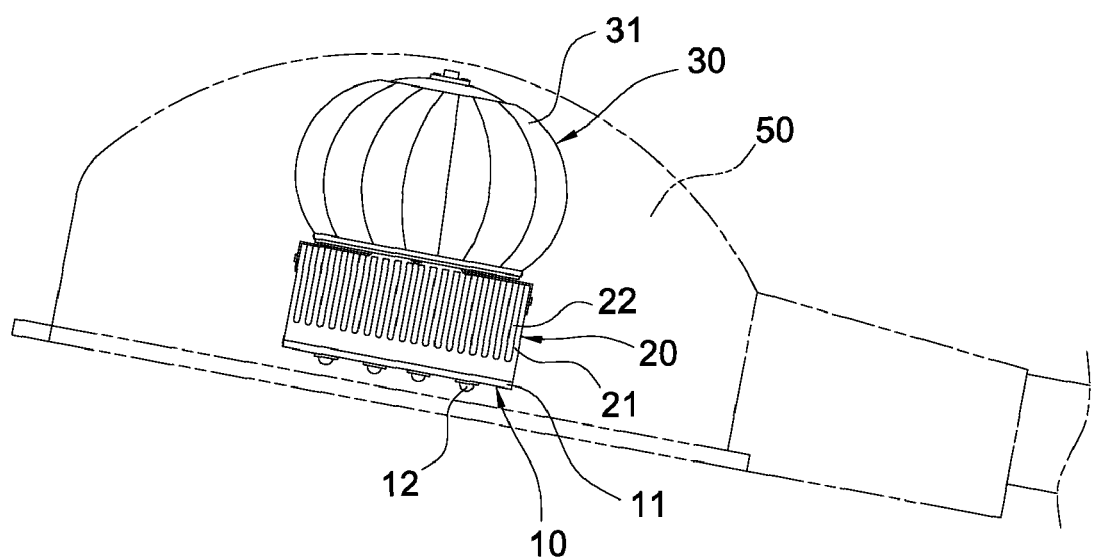
FIG. 6 is a schematic view of an application in a street lamp set according to the present invention.

FIG. 5 and FIG. 6 are two schematic views showing that a LED lamp with a heat dissipating device comprising a turbine ventilator is used in lighting applications. When applied, the heat dissipating device can be installed in a lighting luminance bracket 40 or in a street lamp set 50. The heat generated from the operated LED lighting module 10 will be dissipated in turn by the heat dissipater 20 and the turbine ventilator 30, whereby the heat will not be accumulated on the substrate 11 of the LED lighting module 10. The present invention discloses a turbine ventilator 30 on a heat dissipater 20 where the turbine ventilator 30 is rotated by the air flow resulted from the convention of heated air. The turbine ventilator 30 can dissipate the heat of an LED lighting module 10 without additional electricity, thus saving electrical power and protecting environment. In addition, the operation of the turbine ventilator 30 is quiet and almost makes no noise. Users would not feel uncomfortable using the heat dissipating device.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A heat dissipating device comprising:
  a heat dissipater including a plurality of heat dissipating fins erected from a plate and arranged at interval, wherein a heat dissipating passage is defined between two adjacent heat dissipating fins;
  a turbine ventilator disposed above the heat dissipater, having a plurality of bent fins disposed on a frame and assembled to form a sphere, the turbine ventilator having a central axis and an axial line of the central axis being parallel to the heat dissipating passages; and
  a retainer at the bottom side of the frame of the turbine ventilator fixing the turbine ventilator to the heat dissipater,
  wherein the retainer has a screw hole and the heat dissipating fin has a fixing hole corresponding to the screw hole, a screw threaded in the screw hole and the fixing hole to fix the retainer to the heat dissipating fin, and
  whereby heat dissipated by the heat dissipating passages enters into the turbine ventilator to rotate the bent fins, and when the turbine ventilator keeps rotating, the heat at lower portion of the heat dissipating device is convected to flow upward and rotate the bent fins faster, so that the heat is dissipated with good ventilation and the rotation of the turbine ventilator does not need additional electricity; therefore, enhanced efficiency of heat dissipation is achieved with reduced power consumption.

2. An LED lamp comprising:
  an LED lighting module including a substrate and a plurality of LEDs and the substrate having a heat conducting surface and a light emitting surface on which the LEDs are disposed; and
  a heat dissipating device, comprising:
  a heat dissipater including a plurality of heat dissipating fins erected from a plate and arranged at interval, wherein a heat dissipating passage is defined between two adjacent heat dissipating fins and the plate is in contact with the heat conducting surface; and
  a turbine ventilator disposed above the heat dissipater, having a plurality of bent fins disposed on a frame and assembled to form a sphere, the turbine ventilator having a central axis and an axial line of the central axis being parallel to the heat dissipating passages; and
  a retainer on a bottom side of the frame of the turbine ventilator and the retainer fixing the turbine ventilator to the heat dissipater,
  wherein the retainer has a screw hole and the heat dissipating fin has a fixing hole corresponding to the screw hole, a screw threaded in the screw hole and the fixing hole to fix the retainer to the heat dissipating fin, and
  whereby heat dissipated by the heat dissipating passages enters into the turbine ventilator to rotate the bent fins, and when the turbine ventilator keeps rotating, the heat at lower portion of the heat dissipating device is convected to flow upward and rotate the bent fins faster, so that the heat is dissipated with good ventilation and the rotation of the turbine ventilator does not need additional electricity; therefore, enhanced efficiency of heat dissipation is achieved with reduced power consumption.

* * * * *